(12) United States Patent
Ono (10) Patent No.: US 9,870,807 B2
(45) Date of Patent: Jan. 16, 2018

(54) REFERENCE CURRENT GENERATING CIRCUIT AND MEMORY DEVICE

(71) Applicant: LAPIS Semiconductor Co., Ltd., Yokohama (JP)

(72) Inventor: Tetsuya Ono, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/416,446

(22) Filed: Jan. 26, 2017

(65) Prior Publication Data

US 2017/0221531 A1 Aug. 3, 2017

(30) Foreign Application Priority Data

Jan. 28, 2016 (JP) .................................. 2016-013919

(51) Int. Cl.
*G11C 5/14* (2006.01)
*G05F 3/26* (2006.01)

(52) U.S. Cl.
CPC .............. *G11C 5/147* (2013.01); *G05F 3/267* (2013.01)

(58) Field of Classification Search
CPC ............ G05F 3/245; G05F 3/242; G05F 3/16; G05F 1/463; G05F 3/24; G05F 3/247; G05F 3/262; G05F 3/267; G05F 3/30; G05F 3/265; G11C 16/06; G11C 2207/2254; G11C 5/147; G11C 7/04; G11C 16/28; G11C 7/14; G11C 16/30; G11C 11/5642; G11C 16/26; G11C 11/401; G11C 11/4099; G11C 2029/5006; G11C 2211/4016; G11C 29/02; G11C 29/028; G11C 29/12005

USPC ....... 327/543, 538, 513, 539, 541, 535, 542, 327/546; 363/73
See application file for complete search history.

(56) References Cited

U.S. PATENT DOCUMENTS 5,631,600 A * 5/1997 Akioka .................... G05F 3/267
327/513
7,978,005 B1 * 7/2011 Hyde ...................... G05F 3/242
327/538

FOREIGN PATENT DOCUMENTS

JP 2004-30041 A 1/2004
JP 2004-241083 A 8/2004

* cited by examiner

*Primary Examiner* — Thong Q Le
(74) *Attorney, Agent, or Firm* — Rabin & Berdo, P.C.

(57) ABSTRACT

A reference current generating circuit includes a positive temperature coefficient current source configured to generate a first current, a value of which increases with an increase of an ambient temperature thereof, a negative temperature coefficient current source configured to generate a second current, a value of which decreases with the increase of the ambient temperature thereof, a first current adjustment circuit configured to adjust the first current in accordance with a first adjustment setting value, to thereby generate a positive temperature characteristic current, a second current adjustment circuit configured to adjust the second current in accordance with a second adjustment setting value, to thereby generate a negative temperature characteristic current, and a current amplifier configured to amplify a combined current of the positive temperature characteristic current and the negative temperature characteristic current, to thereby generate a reference current.

13 Claims, 8 Drawing Sheets

REFERENCE CURRENT GENERATING CIRCUIT AND MEMORY DEVICE

TECHNICAL FIELD

The present invention relates to a reference current generating circuit that generates a reference current, and a memory device that includes this reference current generating circuit.

BACKGROUND ARTS

A non-volatile semiconductor storage device configured to store three-valued data or greater in each memory cell of a non-volatile semiconductor memory is known (see Japanese Patent Application Laid-open Publication No. 2004-241083, for example). In this non-volatile semiconductor storage device, the size of a current read out from the memory cell is compared with the size of each of a plurality of reference currents having different current values, respectively, thereby determining the value of the read-out multi-valued data, and the read-out data having the same value is output. Thus, this non-volatile semiconductor storage device includes a reference current generating circuit configured to generate a plurality of reference currents respectively having different current values.

In this configuration, if the reference current fluctuates due to a change in ambient temperature, it is not possible to determine the correct data value.

In order to address this issue, a current source circuit as described in Japanese Patent Application Laid-open Publication No. 2004-30041, for example, is proposed. This current source circuit has a first current generating circuit that generates a first current having the positive temperature characteristic where the current value thereof increases with temperature rise, and a second current generating circuit that generates a second current having the negative temperature characteristic where the current value thereof decreases with temperature rise, and the first and second currents are combined so as to generate a current having a desired temperature characteristic.

SUMMARY OF THE INVENTION

In the current source circuit described above, the change rate of a current value due to temperature rise (increase rate or decrease rate) is determined by a resistance element included in each of the first and second current generating circuits. Thus, if the resistance values of the respective resistance elements vary due to the variations in the manufacturing process and the like, the change rate of the current value due to temperature rise would be inconsistent with a desired change rate, and therefore, it is not possible to generate a current having a desired temperature characteristic.

The present invention aims at providing a reference current generating circuit that can obtain read-out data from a memory cell with a high degree of accuracy even if a current read out from the memory cell changes due to a change in temperature, and that can generate a reference current having a desired temperature characteristic regardless of the variations caused in the manufacturing process. The present invention also aims at providing a memory device that includes the reference current generating circuit.

A reference current generating circuit according to an aspect of the invention includes a positive temperature coefficient current source configured to generate a first current, a value of which increases with an increase of an ambient temperature thereof, a negative temperature coefficient current source configured to generate a second current, a value of which decreases with the increase of the ambient temperature thereof, a first current adjustment circuit configured to adjust the first current in accordance with a first adjustment setting value, to thereby generate a positive temperature characteristic current, a second current adjustment circuit configured to adjust the second current in accordance with a second adjustment setting value, to thereby generate a negative temperature characteristic current, and a current amplifier configured to amplify a combined current of the positive temperature characteristic current and the negative temperature characteristic current, to thereby generate a reference current.

A reference current generating circuit according to another aspect of the invention includes a positive temperature coefficient current source configured to generate a first current, a value of which increases with an increase of an ambient temperature thereof, a negative temperature coefficient current source configured to generate a second current, a value of which decreases with the increase of the ambient temperature thereof, a first current adjustment circuit configured to adjust the first current in accordance with a first adjustment setting value, to thereby generate a first positive temperature characteristic current, a second current adjustment circuit configured to adjust the second current in accordance with a second adjustment setting value, to thereby generate a first negative temperature characteristic current, a third current adjustment circuit configured to adjust the first current in accordance with a third adjustment setting value, to thereby generate a second positive temperature characteristic current, a fourth current adjustment circuit configured to adjust the second current in accordance with a fourth adjustment setting value, to thereby generate a second negative temperature characteristic current, a first current amplifier configured to amplify a combined current of the first positive temperature characteristic current and the first negative temperature characteristic current, to thereby generate a first reference current, and a second current amplifier configured to amplify a combined current of the second positive temperature characteristic current and the second negative temperature characteristic current, to thereby generate a second reference current.

A memory device according to an aspect of the invention includes a memory cell array including a plurality of memory cells, and a reference current generating circuit configured to generate a reference current. The reference current generating circuit includes a positive temperature coefficient current source configured to generate a first current, a value of which increases with an increase of an ambient temperature thereof, a negative temperature coefficient current source configured to generate a second current, a value of which decreases with the increase of the ambient temperature thereof, a first current adjustment circuit configured to adjust the first current in accordance with a first adjustment setting value, to thereby generate a positive temperature characteristic current, a second current adjustment circuit configured to adjust the second current in accordance with a second adjustment setting value, to thereby generate a negative temperature characteristic current, and a current amplifier configured to amplify a combined current of the positive temperature characteristic current and the negative temperature characteristic current, to thereby generate the reference current.

A reference current generating circuit includes first and second current adjustment circuits that respectively adjust the first and second currents, and generates a reference current by combining the currents that were adjusted by the first and second current adjustment circuits. With the first and second current adjustment circuits, it is possible to adjust the combining ratio of the current, a value of which increases with an increase of an ambient temperature thereof, and the current, a value of which decreases with the increase of the ambient temperature thereof.

Thus, with this configuration, even if variations caused in the manufacturing process occur in the respective current sources that generate a current, a value of which increases with the increase of the ambient temperature thereof, and a current, a value of which decreases with the increase of the ambient temperature thereof, the currents can be adjusted by the first and second current adjustment circuits after manufacturing, which allows each product to obtain a reference current that has a desired temperature characteristic and an amount of current. With a memory device including such a reference current generating circuit, even if a current read out from a memory cell fluctuates due to a change in temperature, it is possible to obtain read-out data from the memory cell with a high degree of accuracy.

EMBODIMENTS OF THE INVENTION

Embodiments of the present invention will be explained in detail below with reference to figures.

Figure 1:
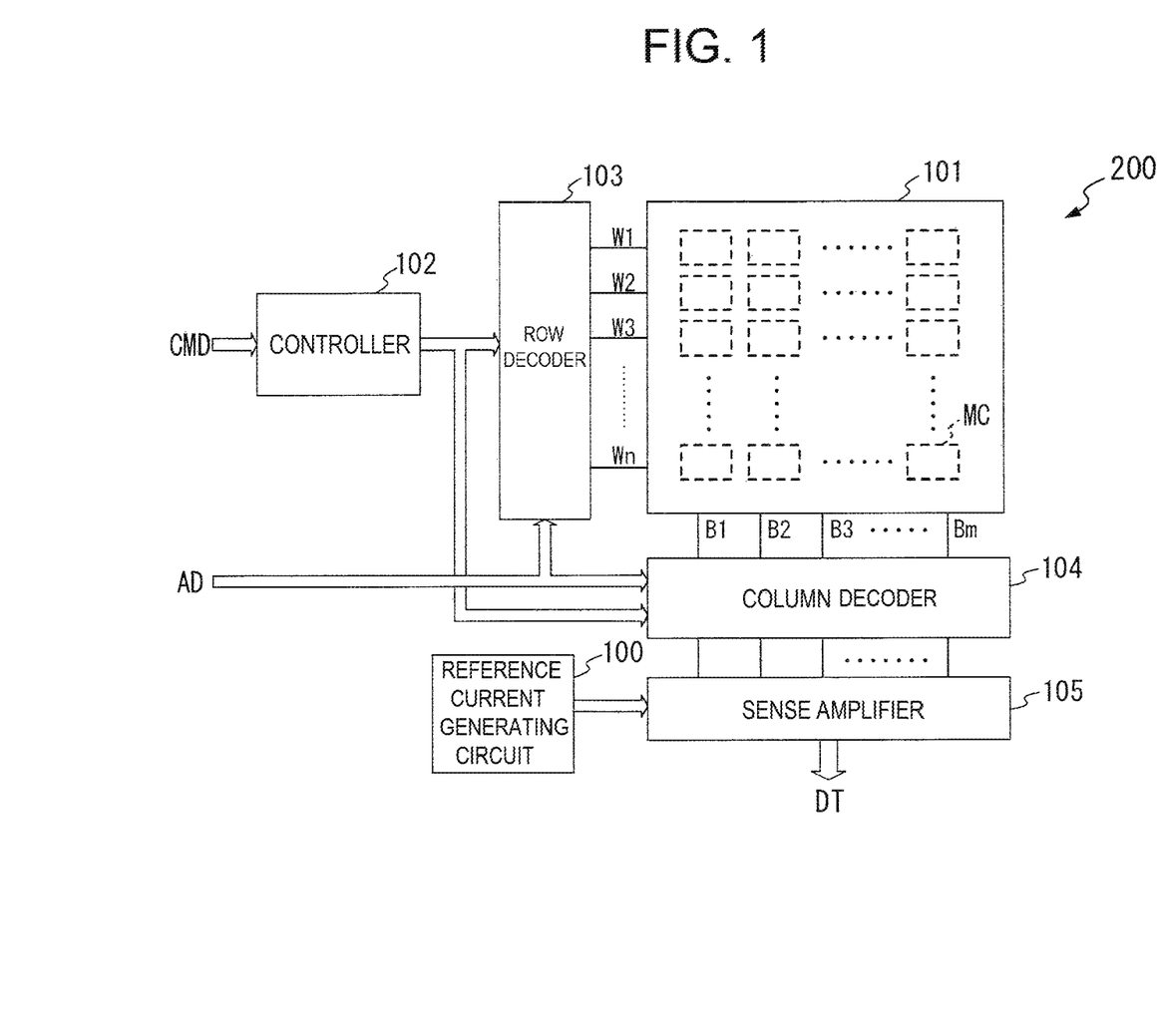
FIG. 1 is a block diagram showing a schematic configuration of a memory device 200 including a reference current generating circuit 100 of the present invention.

FIG. 1 is a block diagram showing a schematic configuration of a memory device 200 including a reference current generating circuit 100 of the present invention. As shown in FIG. 1, the memory device 200 includes a reference current generating circuit 100, a memory cell array 101, a controller 102, a row decoder 103, a column decoder 104, and a sense amplifier 105.

In the memory cell array 101, n (n is an integer of 2 or greater) number of word lines W1 to Wn, m (m is an integer of 2 of greater) number of bit lines B1 to Bm, and a plurality of memory cells MC are arranged in a matrix. One memory cell MC is disposed at each intersection of the word lines W1 to Wn and the bit lines B1 to Bm, and is connected to one or two bit lines and one word line. A memory cell MC is a storage element made of a MOS (metal oxide semiconductor) transistor having the control gate and floating gate, for example, and is capable of reading and writing two-valued or multi-valued (three or greater) data. For example, when the memory cell MC connected to the bit line B1 reads out data, the memory cell MC sends, to the bit line B1, a read-out current that has a current value corresponding to the multi-valued data stored in the memory cell MC.

The controller 102 generates control signals to drive the word lines W1 to Wn and the bit lines B1 to Bm of the memory cell array 101, based on various memory control commands CMD including a read command and a write command. The controller 102 supplies the control signals to the row decoder 103 and the column decoder 104.

The row decoder 103 supplies, in accordance with an address signal AD for specifying a memory address and the control signal supplied from the controller 102, a word line voltage for selecting a word line among the word lines W1 to Wn of the memory cell array 101 that corresponds to the memory address specified by the address signal AD.

The column decoder 104 supplies to the bit lines B1 to Bm of the memory cell array 101 various voltages in accordance with the address signal AD and the control signal supplied from the controller 102. Examples of the various signals include a data read-out voltage when data is to be read out, a data write-in voltage when data is to be written in, and a data deletion voltage when data is to be deleted.

The reference current generating circuit 100 generates one or more reference currents to determine multi-valued data such as two-valued, three-valued or more based on the read-out current. For example, if the memory cell MC is a storage element that stores two-valued data, the reference current generating circuit 100 supplies to the sense amplifier 105 a reference current Iref1 as a threshold value to determine which of the data value [0] or [1] the read-out current provided by the memory cell MC corresponds to. If the memory cell MC is a storage element that stores four-valued data, for example, the reference current generating circuit 100 supplies to the sense amplifier 105 reference currents Iref1 to Iref3 having current values differing from each other as threshold values to determine which one of the data values [00], [01], [10] and [11] the read-out current corresponds to. The respective reference currents Iref1 to Iref3 have the following size relationship, for example:

Iref1<Iref2<Iref3.

If the memory cell MC is a storage element that stores two-valued data, for example, the sense amplifier 105 compares the size of the read-out current that flows through the bit lines B1 to Bm of the memory cell array 101 with the size of the reference current Iref1. If the read-out current is greater than the reference current Iref1, for example, the sense amplifier 105 outputs read-out data DT representing a data value [0], and if the read-out current is equal to or smaller than the reference current Iref1, the sense amplifier 105 outputs read-out data DT representing a data value [1].

If the memory cell MC is a storage element that stores four-valued data, for example, the sense amplifier 105 compares the size of the read-out current with the size of each of the reference currents Iref1 to Iref3. In this case, if the read-out current is greater than the reference current Iref3, for example, the sense amplifier 105 outputs read-out data DT representing a data value [00]. If the read-out current is greater than the reference current Iref2 and equal to or smaller than the reference current Iref3, the sense amplifier 105 outputs read-out data DT representing a data value [01]. If the read-out current is greater than the reference current Iref1 and equal to or smaller than the reference current Iref2, the sense amplifier 105 outputs read-out data DT representing a data value [10]. If the read-out current is smaller than the reference current Iref1, the sense amplifier 105 outputs read-out data DT representing a data value [11].

Below, the reference current generating circuit 100 will be explained in detail.

Figure 2:
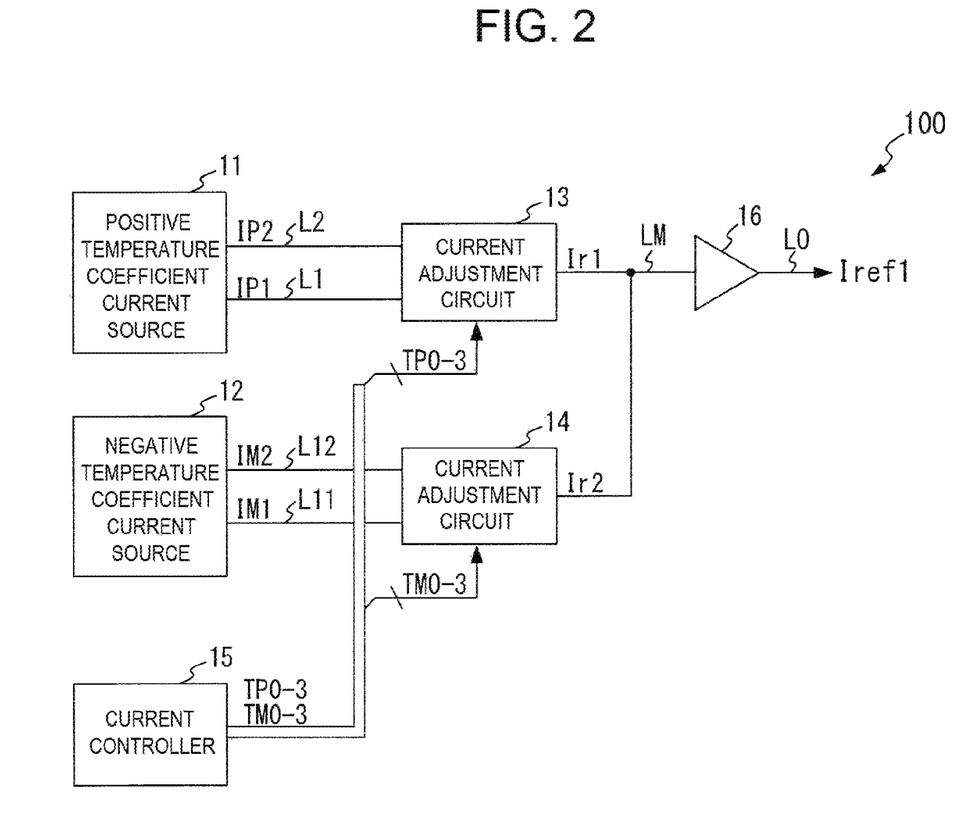
FIG. 2 is a block diagram showing an example of the internal configuration of the reference current generating circuit 100.

FIG. 2 is a block diagram showing the internal configuration of the reference current generating circuit 100 that is used to generate a single reference current Ref1. The configuration shown in FIG. 2 is used for a reference current generating circuit that generates a reference current to determine which of the logic level 0 or 1 the read-out current represents, the read-out current being read out from the memory cell MC having two-valued data stored therein, for example.

As shown in FIG. 2, the reference current generating circuit 100 includes a positive temperature coefficient current source 11, a negative temperature coefficient current source 12, current adjustment circuits 13 and 14, a current controller 15, and a current amplifier 16.

The positive temperature coefficient current source 11 is made of a band-gap reference circuit having a positive temperature coefficient, for example.

Figure 3:
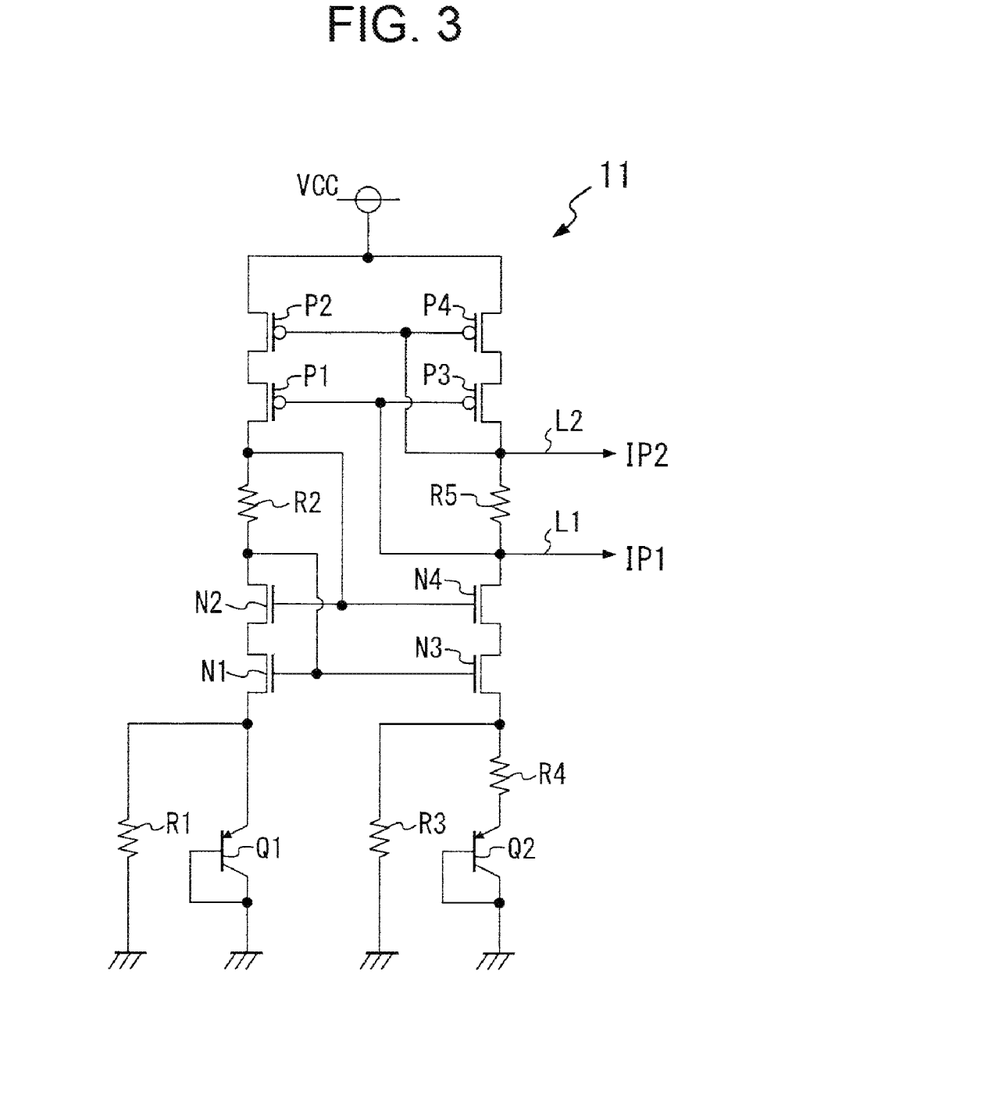
FIG. 3 is a circuit diagram showing the configuration of a positive temperature coefficient current source 11 made of a band-gap reference circuit having a positive temperature coefficient.

FIG. 3 is a circuit diagram showing the configuration of the positive temperature coefficient current source 11 made of a band-gap reference circuit having a positive temperature coefficient. As shown in FIG. 3, the band-gap reference circuit includes PNP transistors Q1 and Q2, n-channel MOS (metal-oxide semiconductor) transistors N1 to N4, p-channel MOS transistors P1 to P4, and resistances R1 to R5.

In FIG. 3, a ground voltage is applied to the base terminal and the collector terminal of the transistor Q1, and the emitter terminal is connected to one end of the resistance R1 and the source terminal of the transistor N1. The other end of the resistance R1 is applied with a ground voltage. The drain terminal of the transistor N1 is connected to the source terminal of the transistor N2, and the gate terminal of the transistor N1 is connected to the drain terminal of the transistor N2 and the gate terminal of the transistor N3. The drain terminal of the transistor N2 is connected to one end of the resistance R2, and the gate terminal of the transistor N2 is connected to the other end of the resistance R2, the gate terminal of the transistor N4 and the drain terminal of the transistor P1. The source terminal of the transistor P1 is connected to the drain terminal of the transistor P2, and the gate terminal of the transistor P1 is connected to a line L1. A power source voltage VCC is applied to the source terminal of the transistor P2, and the gate terminal of the transistor P2 is connected to a line L2.

In FIG. 3, a ground voltage is applied to the base terminal and the collector terminal of the transistor Q2, and the emitter terminal is connected to one end of the resistance R4. The other end of the resistance R4 is connected to the source terminal of the transistor N3 and one end of the resistance R3. The other end of the resistance R3 is applied with a ground voltage. The drain terminal of the transistor N3 is connected to the source terminal of the transistor N4. The drain terminal of the transistor N4 is connected to the line L1 and one end of the resistance R5. The other end of the resistance R5 is connected to the drain terminal of the transistor P3 and the line L2. The source terminal of the transistor P3 is connected to the drain terminal of the transistor P4, and the gate terminal of the transistor P3 is connected to the line L1. A power source voltage VCC is applied to the source terminal of the transistor P4, and the gate terminal of the transistor P4 is connected to the line L2.

The size relationship between the resistance values of R1, R3, and R4 of the resistances R1 to R5 shown in FIG. 3 is as follows:

$R1=R4>R3.$

Figure 4:
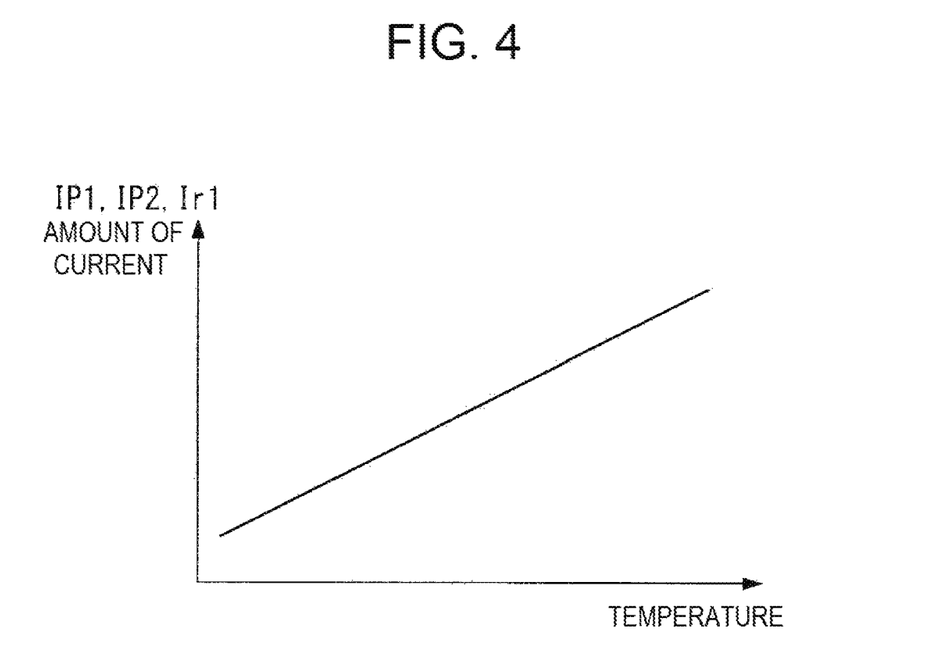
FIG. 4 is a diagram showing respective currents IP1, IP2, and Ir1 at different temperatures.

With this configuration, the positive temperature coefficient current source 11 generates a pair of currents IP1 and IP2 values of which increase with an increase of an ambient temperature thereof as shown in FIG. 4, and supplies the respective currents to the current adjustment circuit 13 via the lines L1 and L2.

The negative temperature coefficient current source 12 is made of a band-gap reference circuit having a negative temperature coefficient, for example.

Figure 5:
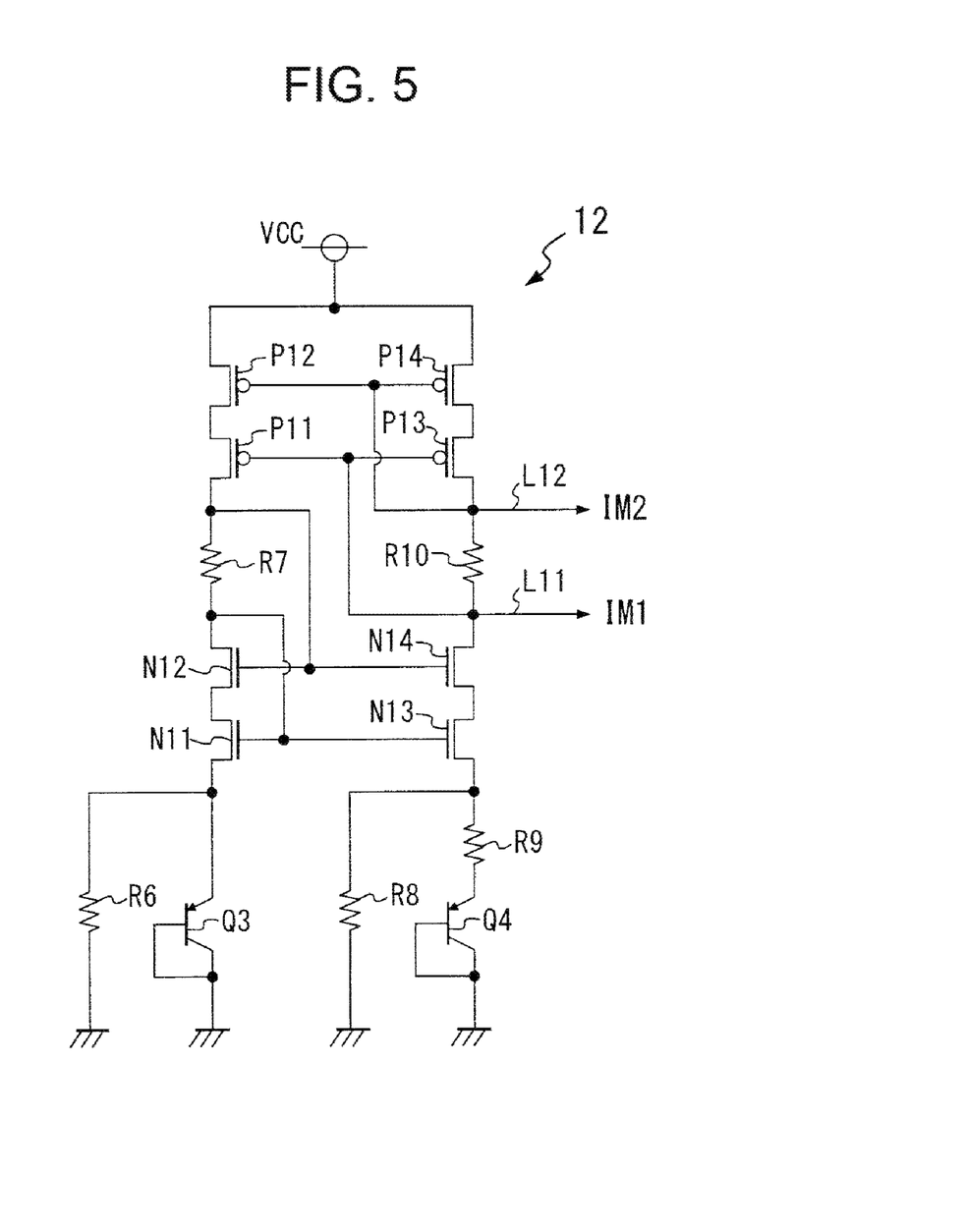
FIG. 5 is a circuit diagram showing the configuration of a negative temperature coefficient current source 12 made of a band-gap reference circuit having a negative temperature coefficient.

FIG. 5 is a circuit diagram showing the configuration of the negative temperature coefficient current source 12 made of a band-gap reference circuit having a negative temperature coefficient.

As shown in FIG. 5, the band-gap reference circuit includes PNP transistors Q3 and Q4, n-channel MOS transistors N11 to N14, p-channel MOS transistors P11 to P14, and resistances R6 to R10.

In FIG. 5, a ground voltage is applied to the base terminal and the collector terminal of the transistor Q3, and the emitter terminal is connected to one end of the resistance R6 and the source terminal of the transistor N11. The other end of the resistance R6 is applied with a ground voltage. The drain terminal of the transistor N11 is connected to the source terminal of the transistor N12, and the gate terminal of the transistor N11 is connected to the drain terminal of the transistor N12 and the gate terminal of the transistor N13. The drain terminal of the transistor N12 is connected to one end of the resistance R7, and the gate terminal of the transistor N12 is connected to the other end of the resistance R7, the gate terminal of the transistor N14, and the drain terminal of the transistor P11. The source terminal of the transistor P11 is connected to the drain terminal of the transistor P12, and the gate terminal of the transistor P11 is connected to a line L11. A power source voltage VCC is applied to the source terminal of the transistor P12, and the gate terminal of the transistor P12 is connected to a line L12.

In FIG. 5, a ground voltage is applied to the base terminal and the collector terminal of the transistor Q4, and the emitter terminal is connected to one end of the resistance R9. The other end of the resistance R9 is connected to the source terminal of the transistor N13 and one end of the resistance R8. The other end of the resistance R8 is applied with a ground voltage. The drain terminal of the transistor N13 is connected to the source terminal of the transistor N14. The drain terminal of the transistor N14 is connected to the line L11 and one end of the resistance R10. The other end of the resistance R10 is connected to the drain terminal of the transistor P13 and the line L12. The source terminal of the transistor P13 is connected to the drain terminal of the transistor P14, and the gate terminal of the transistor P13 is connected to the line L11. A power source voltage VCC is applied to the source terminal of the transistor P14, and the gate terminal of the transistor P14 is connected to the line L12.

The size relationship between the resistance values of R6, R8, and R9 of the resistances R6 to R10 shown in FIG. 5 is as follows:

$R6=R8=R9.$

Figure 6:
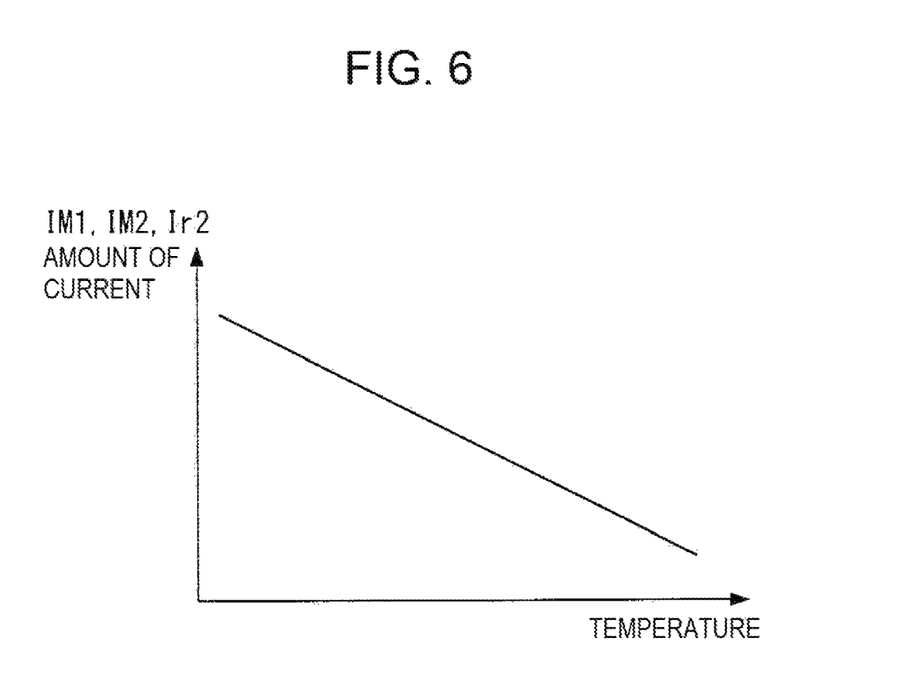
FIG. 6 is a diagram showing respective currents IM1, IM2, and Ir2 at different temperatures.

With this configuration, the negative temperature coefficient current source 12 generates a pair of currents IM1 and IM2 values of which increase with the increase of the ambient temperature thereof as shown in FIG. 6, and supplies the respective currents to the current adjustment circuit 14 via the lines L11 and L12.

The current controller 15 includes a built-in register (not shown in the figure) that stores therein positive temperature coefficient current adjustment data that indicates an adjustment setting value to adjust the currents IP1 and IP2 sent from the positive temperature coefficient current source 11, and negative temperature coefficient current adjustment data that indicates an adjustment setting value to adjust the current values of the currents IM1 and IM2 sent from the negative temperature coefficient current source 12. The current controller 15 generates 4-bit current adjustment signals TP0 to TP3 that correspond to the adjustment setting value specified by the positive temperature coefficient current adjustment data stored in the built-in register. Each of the current adjustment signals TP0 to TP3 is a two-valued signal having one of logic level 0 and logic level 1.

For example, when the adjustment setting value specified by the positive temperature coefficient current adjustment data indicates zero as a current value, the current controller 15 makes all of the current adjustment signals TP0 to TP3 have the logic level 1, and when the adjustment setting value indicates the maximum current value, the current controller 15 makes all of the current adjustment signals TP0 to TP3 have the logic level 0. When the adjustment setting value indicates a first adjustment current value that is greater than zero by one level, the current controller 15 makes only one of the current adjustment signals TP0 to TP3 have the logic level 0, and when the adjustment setting value indicates a second adjustment current value that is greater than the first adjustment current value by one level, the current controller 15 makes only two of the current adjustment signals TP0 to TP3 have the logic level 0. When the adjustment setting value specified by the positive temperature coefficient current adjustment data indicates a third adjustment current value that is greater than the second adjustment current value by one level, the current controller 15 makes three of the current adjustment signals TP0 to TP3 have the logic level 0.

The current controller 15 supplies the current adjustment signals TP0 to TP3 to the current adjustment circuit 13.

The current controller 15 generates 4-bit current adjustment signals TM0 to TM3 based on the adjustment setting value specified by the negative temperature coefficient current adjustment data stored in the built-in register.

For example, when the adjustment setting value specified by the negative temperature coefficient current adjustment data indicates zero as a current value, the current controller 15 makes all of the current adjustment signals TM0 to TM3 have the logic level 1, and when the adjustment setting value indicates the maximum current value, the current controller 15 makes all of the current adjustment signals TM0 to TM3 have the logic level 0. When the adjustment setting value indicates the first adjustment current value, the current controller 15 makes only one of the current adjustment signals TM0 to TM3 have the logic level 0, and when the adjustment setting value indicates a second adjustment current value that is greater than the first adjustment current value by one level, the current controller 15 makes only two of the current adjustment signals TM0 to TM3 have the logic level 0. When the adjustment setting value specified by the negative temperature coefficient current adjustment data indicates a third adjustment current value that is greater than the second adjustment current value by one level, the current controller 15 makes three of the current adjustment signals TM0 to TM3 have the logic level 0.

The current controller 15 supplies the current adjustment signals TM0 to TM3 to the current adjustment circuit 14.

Figure 7:
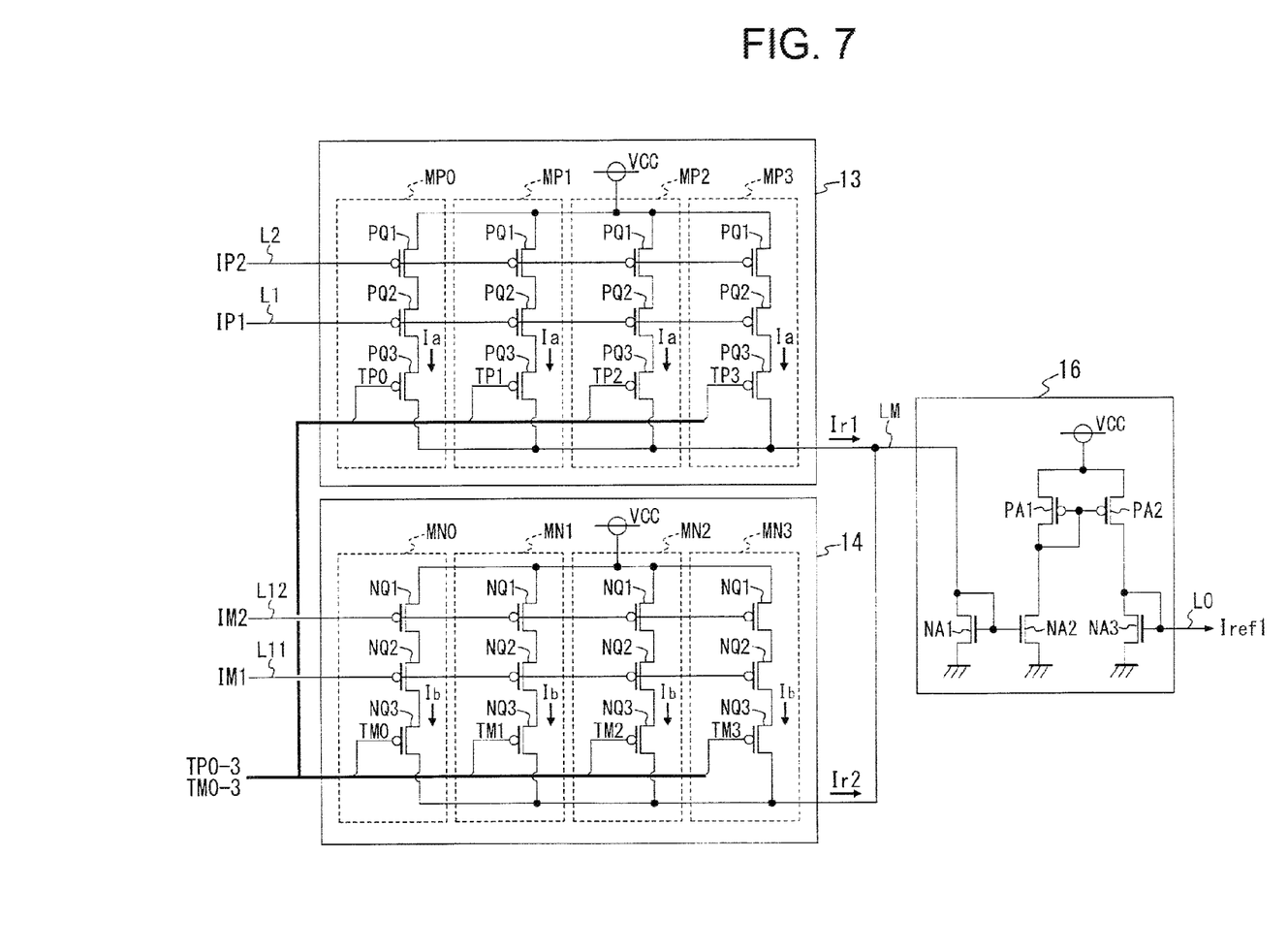
FIG. 7 is a circuit diagram showing the internal configurations of current adjustment circuits 13 and 14 and a current amplifier 16.

FIG. 7 is a circuit diagram showing the internal configurations of the current adjustment circuits 13 and 14 and the current amplifier 16.

The current adjustment circuit 13 includes mirror current output circuits MP0 to MP3 that constitute a four-output type current mirror circuit by being combined with the transistors P3 and P4 of the positive temperature coefficient current source 11. The mirror current output circuits MP0 to MP3 have the same circuit configuration. That is, each of the mirror current output circuits has a current mirror circuit made of p-channel MOS transistors PQ1 and PQ2, and a mirror current combining circuit made of a p-channel MOS transistor PQ3.

In each of the mirror current output circuits MP0 to MP3, a power source voltage VCC is applied to the source terminal of the transistor PQ1, and the drain terminal thereof is connected to the source terminal of the transistor PQ2. In each of the mirror current output circuits MP0 to MP3, the drain terminal of the transistor PQ2 is connected to the source terminal of the transistor PQ3. In the respective mirror current output circuits MP0 to MP3, the gate terminals of the transistors PQ1 are commonly connected to the line L2 of the positive temperature coefficient current source 11. In the respective mirror current output circuits MP0 to MP3, the gate terminals of the transistors PQ2 are commonly connected to the line L1 of the positive temperature coefficient current source 11. In the respective mirror current output circuits MP0 to MP3, the drain terminals of the transistors PQ3 are commonly connected to a current combining line LM.

The gate terminal of the transistor PQ3 of the mirror current output circuit MP0 is supplied with the current adjustment signal TP0, and the gate terminal of the transistor PQ3 of the mirror current output circuit MP1 is supplied with the current adjustment signal TP1. The gate terminal of the transistor PQ3 of the mirror current output circuit MP2 is supplied with the current adjustment signal TP2, and the gate terminal of the transistor PQ3 of the mirror current output circuit MP3 is supplied with the current adjustment signal TP3.

The transistor PQ3 of the mirror current output circuit MP0 is turned off when the current adjustment signal TP0 indicates the logic level 1, and is turned on when the current adjustment signal TP0 indicates the logic level 0 so that a mirror current Ia that has a current corresponding to a resultant current (combined current) of the current IP1 and the current IP2 is sent to the current combining line LM. The transistor PQ3 of the mirror current output circuit MP1 is turned off when the current adjustment signal TP1 indicates the logic level 1, and is turned on when the current adjustment signal TP1 indicates the logic level 0 so that the mirror current Ia is sent to the current combining line LM. The transistor PQ3 of the mirror current output circuit MP2 is turned off when the current adjustment signal TP2 indicates the logic level 1, and is turned on when the current adjustment signal TP2 indicates the logic level 0 so that the mirror current Ia is sent to the current combining line LM. The transistor PQ3 of the mirror current output circuit MP3 is turned off when the current adjustment signal TP3 indicates the logic level 1, and is turned on when the current adjustment signal TP3 indicates the logic level 0 so that the mirror current Ia is sent to the current combining line LM.

That is, the mirror current Ia is sent to the current combining line LM by a mirror current output circuit in which the transistor PQ3 is turned on in accordance with the current adjustment signals TP0 to TP3, among the mirror current output circuits MP0 to MP3. Among the mirror current output circuits MP0 to MP3, a mirror current output circuit in which the transistor PQ3 is turned off does not send out any current. Thus, the current combining line LM allows through a combined current of the mirror current Ia sent from the mirror current output circuits MP0 to MP3, or in other words, the combined current k·Ia (k is the number of transistor PQ3 in the ON state), which is the positive temperature characteristic current Ir1.

In other words, in the current adjustment circuit 13, the respective current mirror circuits made of the transistors PQ1 and PQ2 in the respective mirror current output circuits MP0 to MP3 generate four mirror currents Ia corresponding to a current (IP1+IP2) having the characteristic of increasing the value of the current with temperature rise (will be referred to as the positive temperature characteristic below). Then the respective mirror current combining circuits made of the transistor PQ3 in the respective mirror current output circuits MP0 to MP3 generate a combined current of a specific number of mirror currents Ia that corresponds to the adjustment setting value represented by the first adjustment setting value (TP0 to TP3), among the four mirror currents Ia. This combined current is the positive temperature characteristic current Ir1.

With this configuration, the current adjustment circuit 13 sends to the current combining line LM the positive temperature characteristic current Ir1 that is obtained by adjusting the currents (IP1+IP2), which are generated by the positive temperature coefficient current source 11 and have the positive temperature characteristic, based on the current adjustment signals TP0 to TP3.

The current adjustment circuit 14 includes mirror current output circuits MN0 to MN3 that constitute a four-output type current mirror circuit by being combined with the transistors P13 and P14 of the negative temperature coefficient current source 12. The mirror current output circuits MN0 to MN3 have the same circuit configuration, or in other words, each of the mirror current output circuits MN0 to MN3 has p-channel MOS transistors NQ1 to NQ3.

In each of the mirror current output circuits MN0 to MN3, a power source voltage VCC is applied to the source terminal of the transistor NQ1, and the drain terminal thereof is connected to the source terminal of the transistor NQ2. In each of the mirror current output circuits MN0 to MN3, the drain terminal of the transistor NQ2 is connected to the source terminal of the transistor NQ3. In the respective mirror current output circuits MN0 to MN3, the gate terminals of the transistors NQ1 are commonly connected to the line L12 of the negative temperature coefficient current source 12. In the respective mirror current output circuits MN0 to MN3, the gate terminals of the transistors NQ2 are commonly connected to the line L11 of the negative temperature coefficient current source 12. In the respective mirror current output circuits MN0 to MN3, the drain terminals of the transistors NQ3 are commonly connected to the current combining line LM.

The gate terminal of the transistor NQ3 of the mirror current output circuit MN0 is supplied with the current adjustment signal TM0, and the gate terminal of the transistor NQ3 of the mirror current output circuit MN1 is supplied with the current adjustment signal TM1. The gate terminal of the transistor NQ3 of the mirror current output circuit MN2 is supplied with the current adjustment signal TM2, and the gate terminal of the transistor NQ3 of the mirror current output circuit MN3 is supplied with the current adjustment signal TM3.

The transistor NQ3 of the mirror current output circuit MN0 is turned off when the current adjustment signal TM0 indicates the logic level 1, and is turned on when the current adjustment signal TM0 indicates the logic level 0 so that a mirror current Ib that has a current corresponding to the combined current of the current IM1 and the current IM2 is sent to the current combining line LM. The transistor NQ3 of the mirror current output circuit MN1 is turned off when the current adjustment signal TM1 indicates the logic level 1, and is turned on when the current adjustment signal TM1 indicates the logic level 0 so that the mirror current Ib is sent to the current combining line LM. The transistor NQ3 of the mirror current output circuit MN2 is turned off when the current adjustment signal TM2 indicates the logic level 1, and is turned on when the current adjustment signal TM2 indicates the logic level 0 so that the mirror current Ib is sent to the current combining line LM. The transistor NQ3 of the mirror current output circuit MN3 is turned off when the current adjustment signal TM3 indicates the logic level 1, and is turned on when the current adjustment signal TM3 indicates the logic level 0 so that the mirror current Ib is sent to the current combining line LM.

That is, the mirror current Ib is sent to the current combining line LM by the mirror current output circuit in which the transistor NQ3 is turned on in accordance with the current adjustment signals TM0 to TM3, among the mirror current output circuits MN0 to MN3. The mirror current output circuits MN0 to MN3 do not send out any current if the transistor NQ3 is turned off. Thus, the current combining line LM allows through a combined current of a specific number of the mirror currents Ib sent from the mirror current output circuits MN0 to MN3, or in other words, the combined current k·Ib (k is the number of transistor NQ3 that is turned on), which is the negative temperature characteristic current Ir2.

In other words, in the current adjustment circuit 14, the respective current mirror circuits made of the transistors NQ1 and NQ2 in the respective mirror current output circuits MN0 to MN3 generate four mirror currents Ib corresponding to a current (IM1+IM2) having the characteristic of decreasing the value of the current with temperature rise (will be referred to as the negative temperature characteristic below). Then the respective mirror current combining circuits made of the transistor NQ3 in the respective mirror current output circuits MN0 to MN3 generate a combined current of a specific number of the mirror currents Ib that corresponds to the adjustment setting value represented by the second adjustment setting value (TM0 to TM3), among the four mirror currents Ib. This combined current is the negative temperature characteristic current Ir2.

With this configuration, the current adjustment circuit 14 sends to the current combining line LM the negative temperature characteristic current Ir2 that is obtained by adjusting the currents (IM1+IM2), which are generated by the negative temperature coefficient current source 12 and have the negative temperature characteristic, based on the current adjustment signals TM0 to TM3.

A combined current of the positive temperature characteristic current Ir1 sent from the current adjustment circuit 13 and the negative temperature characteristic current Ir2 sent from the current adjustment circuit 14 is supplied to the current amplifier 16 via the current combining line LM.

As shown in FIG. 7, the current amplifier 16 includes n-channel MOS transistors NA1 to NA3 and p-channel MOS transistors PA1 to PA2. A ground voltage is applied to the source terminal of the transistor NA1 and the drain terminal and the gate terminal thereof are respectively connected to the current combining line LM and the gate terminal of the transistor NA2. A ground voltage is applied to the source terminal of the transistor NA2 and the drain terminal thereof is connected to the drain terminal and the gate terminal of the transistor PA1. The gate terminals of the transistors PA1 and PA2 are connected to each other, and each of the source terminals is applied with a power source voltage VCC. The drain terminal of the transistor PA2 is connected to the drain terminal of the transistor NA3, and an output line LO. A ground voltage is applied to the source terminal of the transistor NA3, and the gate terminal thereof is connected to the output line LO.

With this configuration, the current amplifier 16 amplifies the current supplied via the current combining line LM, or in other words, a combined current of the positive temperature characteristic current Ir1 and the negative temperature characteristic current Ir2, and outputs the amplified current as the reference current Iref1 via the output line LO.

As described above, in the reference current generating circuit 100 having the configuration shown in FIG. 2, the positive temperature coefficient current source 11 generates the first current (IP1, IP2) having the positive temperature characteristic of increasing with temperature rise, and generates the second current (IM1, IM2) having the negative temperature characteristic of decreasing with temperature rise. The current adjustment circuit 13 adjusts the first current having the positive temperature characteristic in accordance with the first adjustment setting value (TP0 to TP3), thereby obtaining the positive temperature characteristic current Ir1. The current adjustment circuit 14 adjusts the amount of the second current having the negative temperature characteristic in accordance with the second adjustment setting value (TM0 to TM3), thereby obtaining the negative temperature characteristic current Ir2. Then the output circuit (LM, 16) outputs a combined current of the positive temperature characteristic current Ir1 and the negative temperature characteristic current Ir2 as the reference current Iref1.

Thus, the reference current generating circuit 100 is configured so as to adjust the combining ratio of a current with the positive temperature characteristic and a current with the negative temperature characteristics as well as the amout of the reference current Iref1 by the current adjustment circuits 13 and 14 in outputting the reference current Iref1, which is a combined current of the positive temperature characteristic current and the negative temperature characteristic current.

With this configuration, even if the positive temperature coefficient current source 11 or the negative temperature coefficient current source 12 has variations caused in the manufacturing process, the amount of the current can be adjusted by the current adjustment circuits 13 and 14 after manufacturing. This makes it possible to obtain the reference current Iref1 having desired temperature coefficient and current value in each product.

Thus, with the memory device 200 that includes the reference current generating circuit 100, even if a current read out from the memory cell MC fluctuates due to a change in temperature, it is possible to obtain the read-out data DT from the memory cell with a high degree of accuracy.

Figure 8:
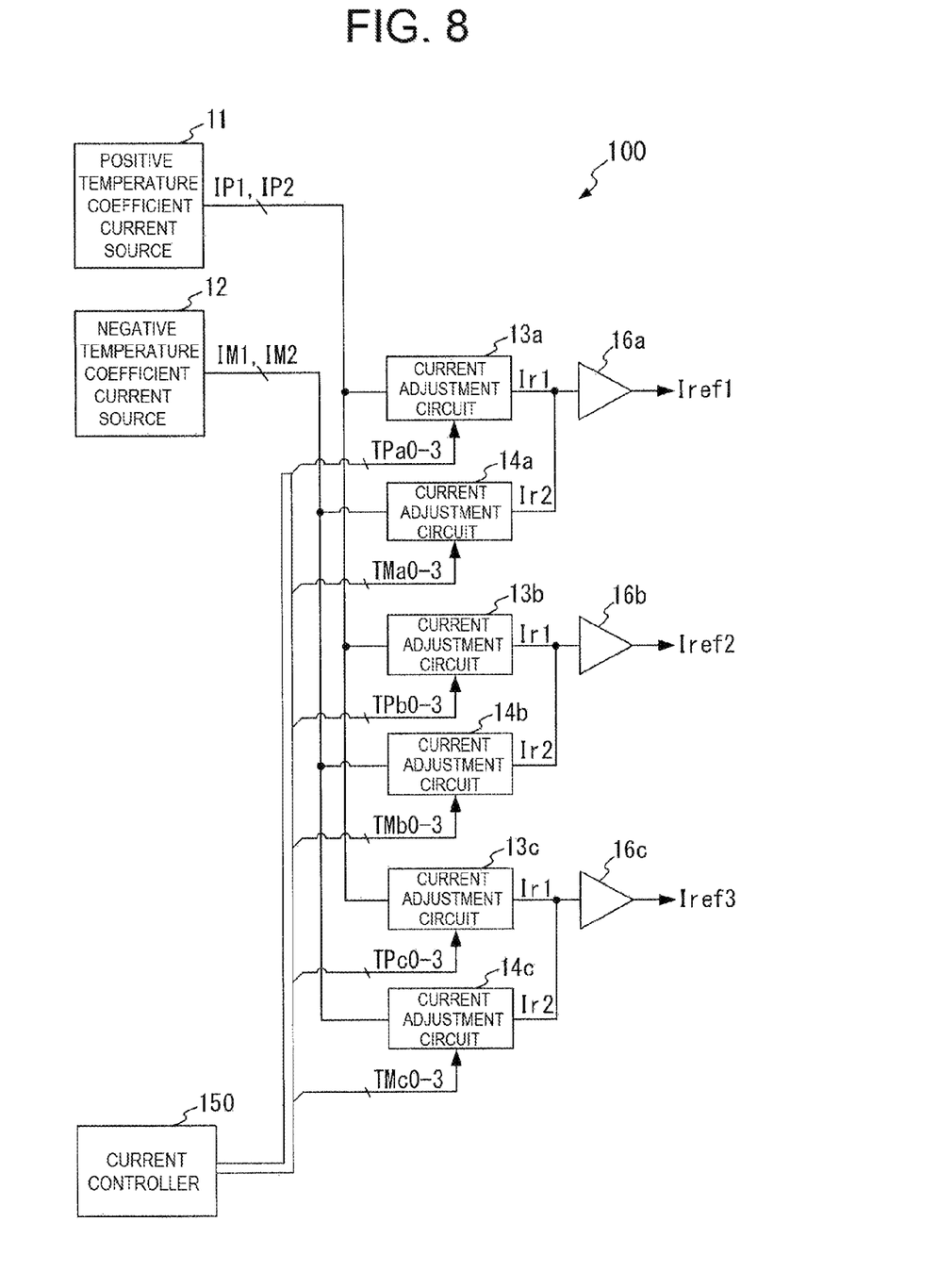
FIG. 8 is a block diagram showing another example of the internal configuration of the reference current generating circuit 100.

FIG. 8 is a block diagram showing the configuration of the reference current generating circuit 100 that is used to generate three reference currents Iref1 to Iref3 each if which has an amount differing from each other. The configuration shown in FIG. 8 is used for a reference current generating circuit that generates three reference currents to determine which of the four data values [00], [01], [10], and [11] the read-out current represents, the read-out current being read out from the memory cell MC having four-valued data stored therein, for example.

In the configuration shown in FIG. 8, the reference current generating circuit 100 includes a positive temperature coefficient current source 11, a negative temperature coefficient current source 12, current adjustment circuits 13a to 13c, current adjustment circuits 14a to 14c, current amplifiers 16a to 16c, and a current controller 150.

The positive temperature coefficient current source 11 shown in FIG. 8 is the same as the positive temperature coefficient current source 11 shown in FIG. 2, and has the circuit configuration shown in FIG. 3, for example. However, the positive temperature coefficient current source 11 shown in FIG. 8 supplies currents IP1 and 1P2 having the positive temperature characteristic shown in FIG. 4 to each of the current adjustment circuits 13a to 13c via the lines L1 and L2.

The negative temperature coefficient current source 12 shown in FIG. 8 is the same as the negative temperature coefficient current source 12 shown in FIG. 2, and has the circuit configuration shown in FIG. 5, for example. However, the negative temperature coefficient current source 12 shown in FIG. 8 supplies currents IM1 and IM2 having the negative temperature characteristic shown in FIG. 6 to each of the current adjustment circuits 14a to 14c via the lines L11 and L12.

The current controller 150 includes a built-in register (not shown in the figure) that stores therein first to third positive temperature coefficient current adjustment data that indicates adjustment setting values to adjust the currents (IP1 and 1P2) having the positive temperature characteristic, and first to third negative temperature coefficient current adjustment data that indicates adjustment setting values to the currents (IM1 and IM2) having the negative temperature characteristic. The first positive temperature coefficient current adjustment data indicates an adjustment setting value for the current adjustment conducted on the currents (IP1, IP2) when the reference current Iref1 is generated. The second positive temperature coefficient current adjustment data indicates an adjustment setting value for the current adjustment conducted on the currents (IP1, IP2) when the reference current Iref2 is generated. The third positive temperature coefficient current adjustment data indicates an adjustment setting value for the current adjustment conducted on the currents (IP1, IP2) when the reference current Iref3 is generated. The first negative temperature coefficient current adjustment data indicates an adjustment setting value for the current adjustment conducted on the currents (IM1, IM2) when the reference current Iref1 is generated. The second negative temperature coefficient current adjustment data indicates an adjustment setting value for the current adjustment conducted on the currents (IM1, IM2) when the reference current Iref2 is generated. The third negative temperature coefficient current adjustment data indicates an adjustment setting value for the current adjustment conducted on the currents (IM1, IM2) when the reference current Iref3 is generated.

The current controller 150 generates current adjustment signals TPa0 to TPa3, TPb0 to TPb3, and TPc0 to TPc3 based on the adjustment setting values specified by the first to third positive temperature coefficient current adjustment data stored in the built-in register. Each of the current adjustment signals TPa0 to TPa3, TPb0 to TPb3, and TPc0 to TPc3 is a two-valued signal having one of logic level 0 and logic level 1.

For example, when the adjustment setting value specified by the first positive temperature coefficient current adjustment data indicates zero as a current value, the current controller 150 makes all of the current adjustment signals TPa0 to TPa3 have the logic level 1, and when the adjustment setting value indicates the maximum current, the current controller 15 makes all of the current adjustment signals TPa0 to TPa3 have the logic level 0. When the adjustment setting value indicates a first adjustment current value that is greater than zero by one level, the current controller 150 makes only one of the current adjustment signals TPa0 to TPa3 have the logic level 0, and when the adjustment setting value indicates a second adjustment current value that is greater than the first adjustment current value by one level, the current controller 15 makes only two of the current adjustment signals TPa0 to TPa3 have the logic level 0. When the adjustment setting value specified by the first positive temperature coefficient current adjustment data indicates a third adjustment current value that is greater than the second adjustment current value by one level, the current controller 150 makes three of the current adjustment signals TPa0 to TPa3 have the logic level 0.

The current controller 150 supplies the current adjustment signals TPa0 to TPa3 to the current adjustment circuit 13a.

Similarly, the current controller 150 generates the current adjustment signals TPb0 to TPb3 indicating the adjustment setting value specified by the second positive temperature coefficient current adjustment data, and supplies the current adjustment signals TPb0 to TPb3 to the current adjustment circuit 13b. The current controller 150 also generates the current adjustment signals TPc0 to TPc3 indicating the adjustment setting value specified by the third positive temperature coefficient current adjustment data, and supplies the current adjustment signals TPc0 to TPc3 to the current adjustment circuit 13c.

Furthermore, the current controller 150 generates current adjustment signals TMa0 to TMa3, TMb0 to TMb3, and TMc0 to TMc3 based on the adjustment setting values specified by the first to third negative temperature coefficient current adjustment data stored in the built-in register. Each of the current adjustment signals TMa0 to TMa3, TMb0 to TMb3, and TMc0 to TMc3 is a two-valued signal having one of logic level 0 and logic level 1.

For example, when the adjustment setting value specified by the first negative temperature coefficient current adjustment data indicates zero as a current value, the current controller 150 makes all of the current adjustment signals TMa0 to TMa3 have the logic level 1, and when the adjustment setting value indicates the maximum current, the current controller 150 makes all of the current adjustment signals TMa0 to TMa3 have the logic level 0. When the adjustment setting value indicates a first adjustment current value that is greater than zero by one level, the current controller 150 makes only one of the current adjustment signals TMa0 to TMa3 have the logic level 0, and when the adjustment setting value indicates a second adjustment current value that is greater than the first adjustment current value by one level, the current controller 15 makes only two of the current adjustment signals TMa0 to TMa3 have the logic level 0. When the adjustment setting value specified by the first negative temperature coefficient current adjustment data indicates a third adjustment current value that is greater than the second adjustment current value by one level, the current controller 150 makes three of the current adjustment signals TMa0 to TMa3 have the logic level 0.

The current controller 150 supplies the current adjustment signals TMa0 to TMa3 to the current adjustment circuit 14a.

Similarly, the current controller 150 generates the current adjustment signals TMb0 to TMb3 indicating the adjustment setting value specified by the second negative temperature coefficient current adjustment data, and supplies the current adjustment signals TMb0 to TMb3 to the current adjustment circuit 14b. The current controller 150 also generates the current adjustment signals TMc0 to TMc3 indicating the adjustment setting value specified by the third negative temperature coefficient current adjustment data, and supplies the current adjustment signals TMc0 to TMc3 to the current adjustment circuit 14c.

Each of the current adjustment circuits 13a to 13c has the circuit configuration shown in FIG. 7 like the current adjustment circuit 13 of FIG. 2. Each of the current adjustment circuits 14a to 14c has the circuit configuration shown in FIG. 7 like the current adjustment circuit 14 of FIG. 2. Also, each of the current amplifiers 16a to 16c shown in FIG. 8 has the circuit configuration shown in FIG. 7 like the current amplifier 16 of FIG. 2.

With this configuration, a combined current of the positive temperature characteristic current Ir1 that was adjusted by the current adjustment circuit 13a and the negative temperature characteristic current Ir2 that was adjusted by the current adjustment circuit 14a is amplified by the current amplifier 16a and output as the reference current Iref1. A combined current of the positive temperature characteristic current Ir1 that was adjusted by the current adjustment circuit 13b and the negative temperature characteristic current Ir2 that was adjusted by the current adjustment circuit 14b is amplified by the current amplifier 16b and output as the reference current Iref2. A combined current of the positive temperature characteristic current Ir1 that was adjusted by the current adjustment circuit 13c and the negative temperature characteristic current Ir2 that was adjusted by the current adjustment circuit 14c is amplified by the current amplifier 16c and output as the reference current Iref3.

In the configuration shown in FIG. 8, in combining the current (IP1, IP2) having the positive current characteristic and the current (IM1, IM2) having the negative current characteristic, the respective currents are independently adjusted by the current adjustment circuits (13a to 13c, 14a to 14c), which are provided for each reference current, thereby obtaining the reference currents Iref1 to Iref3 having current values differing from each other. With this configuration, even if the positive temperature coefficient current source 11 or the negative temperature coefficient current source 12 has variations caused in the manufacturing process, the current can be adjusted by the current adjustment circuits (13a to 13c, 14a to 14c) after manufacturing. This makes it possible to adjust the reference currents Iref1 to Iref3 independently of each other to obtain desired temperature coefficient and amount of current in each product.

In each of the current adjustment circuits 13a to 13c shown in FIG. 8, the mirror current output circuits MP0 to MP3 shown in FIG. 7 each generate a mirror current Ia that corresponds to the currents (IP1, IP2), which were generated by the positive temperature coefficient current source 11, for the four systems. Then, in each of the current adjustment circuits 13a to 13c, a specific number of the mirror currents Ia are combined so as to correspond to the adjustment setting values specified by the current adjustment signals (TPa0 to TPa3, TPb0 to TPb3, TPc0 to TPc3), thereby generating the positive temperature characteristic current Ir1 that has been adjusted.

In each of the current adjustment circuits 14a to 14c shown in FIG. 8, the mirror current output circuits MN0 to MN3 shown in FIG. 7 each generate a mirror current Ib that corresponds to the currents (IM1, IM2), which were generated by the negative temperature coefficient current source 12, for the four systems. Then, in each of the current adjustment circuits 14a to 14c, a specific number of the mirror currents Ib are combined so as to correspond to the adjustment setting values specified by the current adjustment signals (TMa0 to TMa3, TMb0 to TMb3, TMc0 to TMc3), thereby generating the negative temperature characteristic current Ir2 that has been adjusted.

As described above, each of the current adjustment circuits 13a to 13c does not directly change the current value of the current (IP1, IP2) generated in the positive temperature coefficient source 11. Similarly, each of the current adjustment circuits 14a to 14c does not directly change the current (IM1, IM2) generated in the negative temperature coefficient source 12.

Thus, the reference current generating circuit 100 having the configuration shown in FIGS. 7 and 8 needs to have only one positive temperature coefficient current source 11 and one negative temperature coefficient current source 12 to generate three reference currents Iref1 to Iref3 having amounts differing from each other. This makes it possible to reduce the circuit size significantly compared to the case in which the positive temperature coefficient current source 11 and the negative temperature coefficient current source 12 need to be provided for each of the reference currents Iref1 to Iref3. Thus, with the memory device 200 including the reference current generating circuit 100 having the configuration shown in FIGS. 7 and 8, even if a current read out from the memory cell MC fluctuates due to a change in temperature, it is possible to obtain the read-out data DT from the memory cell with a high degree of accuracy.

The embodiment shown in FIG. 8 is configured to generate three reference currents Iref1 to Iref3 to determine one of the four data values that the read-out current corresponds to, but it is also possible to generate four or more reference currents so as to make judgment on five or more data values. In this case, the current adjustment circuits (13, 14) and the current amplifier 16 need to be added so as to correspond to the number of reference currents, but because it is not necessary to add the positive temperature coefficient current source 11 or the negative temperature coefficient current source 12, an increase in circuit size can be minimized.

In the embodiment shown in FIG. 7, a current mirror circuit with four outputs is used for each of the current adjustment circuits 13 and 14, but by increasing the number of output, finer adjustment on temperature coefficient and current value of the reference current is possible. If it is not necessary for each of the current adjustment circuits 13 and 14 to conduct fine adjustment, a current mirror circuit with two outputs may be used.

That is, any current mirror circuit may be used for the current adjustment circuit 13 as long as it has a current mirror circuit (PQ1, PQ2) that generates first to N-th (N is an integer of 2 or greater) mirror currents (Ia) corresponding to the first current (IP1, IP2) having the positive temperature characteristic, and a mirror current combining circuit (PQ3) that outputs, as the positive temperature characteristic current (Ir1), a combined current of a specific number of mirror currents corresponding to the first adjustment setting value (TP0 to TP3) among the first to N-th mirror currents. Also, any current mirror circuit may be used for the current adjustment circuit 14 as long as it has a current mirror circuit (NQ1, NQ2) that generates first to N-th mirror currents (Ib) corresponding to the second current (IM1, IM2) having the negative temperature characteristic, and a mirror current combining circuit (NQ3) that outputs, as the negative temperature characteristic current (Ir2), a combined current (resultant current) of a specific number of mirror currents corresponding to the second adjustment setting value (TM0 to TM3) among the first to N-th mirror currents.

What is claimed is:

1. A reference current generating circuit, comprising:
   a positive temperature coefficient current source configured to generate a plurality of first currents, a value of each of which increases with an increase of an ambient temperature thereof;
   a negative temperature coefficient current source configured to generate a plurality of second currents, a value of each of which decreases with the increase of the ambient temperature thereof;
   a first current adjustment circuit configured to generate a positive temperature characteristic current by combining the first currents based on a first adjustment setting signal;
   a second current adjustment circuit configured to generate a negative temperature characteristic current by combining the second currents based on a second adjustment setting signal; and
   a current amplifier configured to amplify a combined current of the positive temperature characteristic current and the negative temperature characteristic current, to thereby generate a reference current.

2. The reference current generating circuit according to claim 1,
   wherein the first current adjustment circuit includes:
   a first current mirror circuit configured to generate a number N of first mirror currents respectively corresponding to the first currents, N being an integer of 2 or greater; and
   a first mirror current combining circuit configured to select a number M of the N first mirror currents, to thereby obtain the positive temperature characteristic current, M being an integer of 1 or greater and being equal to or less than N, M corresponding to the first adjustment setting signal, and
   wherein the second current adjustment circuit includes:
   a second current mirror circuit configured to generate a number N of second mirror currents respectively corresponding to the second currents; and
   a second mirror current combining circuit configured to select a number K of the N second mirror currents, to thereby obtain the negative temperature characteristic current, K being an integer of 1 or greater and being equal to or less than N, K corresponding to the second adjustment setting signal.

3. The reference current generating circuit according to claim 1, wherein the positive temperature coefficient current source and the negative temperature coefficient current source are each made of a band-gap reference circuit.

4. A reference current generating circuit, comprising:
   a positive temperature coefficient current source configured to generate a first current, a value of which increases with an increase of an ambient temperature thereof;

a negative temperature coefficient current source configured to generate a second current, a value of which decreases with the increase of the ambient temperature thereof;

a first current adjustment circuit configured to adjust the first current in accordance with a first adjustment setting signal, to thereby generate a first positive temperature characteristic current;

a second current adjustment circuit configured to adjust the second current in accordance with a second adjustment setting signal, to thereby generate a first negative temperature characteristic current;

a third current adjustment circuit configured to adjust the first current in accordance with a third adjustment setting signal, to thereby generate a second positive temperature characteristic current;

a fourth current adjustment circuit configured to adjust the second current in accordance with a fourth adjustment setting signal, to thereby generate a second negative temperature characteristic current;

a first current amplifier configured to amplify a combined current of the first positive temperature characteristic current and the first negative temperature characteristic current, to thereby generate a first reference current; and a second current amplifier configured to amplify a combined current of the second positive temperature characteristic current and the second negative temperature characteristic current, to thereby generate a second reference current.

5. The reference current generating circuit according to claim 4, wherein the first current adjustment circuit includes:
a first current mirror circuit configured to generate a number N of first mirror currents corresponding to the first current, N being an integer of 2 or greater; and
a first mirror current combining circuit configured to select a number M of the N first mirror currents, to thereby obtain the first positive temperature characteristic current, M being an integer of 1 or greater and being equal to or less than N, M corresponding to a first adjustment setting value included in the first adjustment setting signal, wherein the second current adjustment circuit includes:
a second current mirror circuit configured to generate a number N of second mirror currents corresponding to the second current; and
a second mirror current combining circuit configured to select a number K of the N second mirror currents, to thereby obtain the first negative temperature characteristic current, K being an integer of 1 or greater and being equal to or less than N, K corresponding to a second adjustment setting value included in the second adjustment setting signal, wherein the third current adjustment circuit includes:
a third current mirror circuit configured to generate a number N of third mirror currents corresponding to the first current; and
a third mirror current combining circuit configured to select a number P of the N third mirror currents, to thereby obtain the second positive temperature characteristic current, P being an integer of 1 or greater and being equal to or less than N, P corresponding to a third adjustment setting value included in the third adjustment setting signal, and wherein the fourth current adjustment circuit includes:
a fourth current mirror circuit configured to generate a number N of fourth mirror currents corresponding to the second current; and
a fourth mirror current combining circuit configured to select a number Q of the N fourth mirror currents, to thereby obtain the second negative temperature characteristic current, Q being an integer of 1 or greater and being equal to or less than N, Q corresponding to a fourth adjustment setting value included in the fourth adjustment setting signal.

6. The reference current generating circuit according to claim 4, wherein the positive temperature coefficient current source and the negative temperature coefficient current source are each made of a band-gap reference circuit.

7. The reference current generating circuit according to claim 1, further comprising a current controller configured to supply the first adjustment setting signal and the second adjustment setting signal to the first current adjustment circuit and the second current adjustment circuit, respectively.

8. The reference current generating circuit according to claim 7, wherein the first current adjustment circuit generates a current with a predetermined positive temperature characteristic as the positive temperature characteristic current based on the first adjustment setting signal, and the second current adjustment circuit generates a current with a predetermined negative temperature characteristic as the negative temperature characteristic current based on the second adjustment setting signal.

9. A memory device, comprising:
a memory cell array including a plurality of memory cells;
a reference current generating circuit configured to generate a reference current, the reference current generating circuit including:
a positive temperature coefficient current source configured to generate a plurality of first currents, a value of each of which increases with an increase of an ambient temperature thereof;
a negative temperature coefficient current source configured to generate a plurality of second currents, a value of which decreases with the increase of the ambient temperature thereof;
a first current adjustment circuit configured to generate a positive temperature characteristic current by combining the first currents based on a first adjustment setting signal;
a second current adjustment circuit configured to generate a negative temperature characteristic current by combining the second currents based on a second adjustment setting signal; and
a current amplifier configured to amplify a combined current of the positive temperature characteristic current and the negative temperature characteristic current, to thereby generate a reference current.

10. The memory device according to claim 9,
wherein the first current adjustment circuit includes:
a first current mirror circuit configured to generate a number N of first mirror currents respectively corresponding to the first currents, N being an integer of 2 or greater; and
a first mirror current combining circuit configured to select a number M of the N first mirror currents, to thereby obtain the positive temperature characteristic current, M being an integer of 1 or greater and being equal to or less than N, M corresponding to the first adjustment setting signal, and wherein the second current adjustment circuit includes:
a second current mirror circuit configured to generate a number N of second mirror currents respectively corresponding to the second currents; and
a second mirror current combining circuit configured to select a number K of the N second mirror currents, to thereby obtain the negative temperature characteristic current, K being an integer of 1 or greater and being equal to or less than N, K corresponding to the second adjustment setting signal.

11. The memory device according to claim 9, wherein the positive temperature coefficient current source and the negative temperature coefficient current source are each made of a band-gap reference circuit.

12. The memory device according to claim 9, further comprising a current controller configured to supply the first adjustment setting signal and the second adjustment setting signal to the first current adjustment circuit and the second current adjustment circuit, respectively.

13. The reference current generating circuit according to claim 12, wherein the first current adjustment circuit generates a current to have a predetermined positive temperature characteristic as the positive temperature characteristic current based on the first adjustment setting signal, and the second current adjustment circuit generates a current to have a predetermined negative temperature characteristic as the negative temperature characteristic current based on the second adjustment setting signal.

* * * * *